US012796126B2

(12) United States Patent
Kim et al.

(10) Patent No.: US 12,796,126 B2
(45) Date of Patent: Nov. 10, 2026

(54) IMAGE SENSOR

(71) Applicant: SAMSUNG ELECTRONICS CO., LTD., Suwon-si (KR)

(72) Inventors: Taehan Kim, Suwon-si (KR); Dongmin Keum, Suwon-si (KR); Bumsuk Kim, Suwon-si (KR); Jinho Kim, Suwon-si (KR); Yunki Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 206 days.

(21) Appl. No.: 18/365,522

(22) Filed: Aug. 4, 2023

(65) Prior Publication Data

US 2024/0186348 A1 Jun. 6, 2024

(30) Foreign Application Priority Data

Dec. 6, 2022 (KR) ........................ 10-2022-0168873

(51) Int. Cl.
*H10F 39/00* (2025.01)
*H04N 25/704* (2023.01)

(52) U.S. Cl.
CPC ....... *H10F 39/8023* (2025.01); *H04N 25/704* (2023.01); *H10F 39/8053* (2025.01); *H10F 39/8063* (2025.01); *H10F 39/807* (2025.01)

(58) Field of Classification Search
None
See application file for complete search history.

(56) References Cited

U.S. PATENT DOCUMENTS

| | | | | |
|---|---|---|---|---|
| 7,656,453 | B2 | 2/2010 | Nishi | |
| 9,515,114 | B2 | 12/2016 | Ootsuka | |
| 10,002,899 | B2 | 6/2018 | Chou et al. | |
| 11,372,312 | B2 | 6/2022 | Pyo et al. | |
| 2009/0251556 | A1* | 10/2009 | Mabuchi | H10F 39/8053 348/222.1 |
| 2017/0053956 | A1* | 2/2017 | Nakamura | H10F 39/8053 |

(Continued)

FOREIGN PATENT DOCUMENTS

| | | |
|---|---|---|
| JP | 2006-93456 | 4/2006 |
| JP | 2016-096234 | 5/2016 |

(Continued)

*Primary Examiner* — Twyler L Haskins
*Assistant Examiner* — Wesley J Chiu
(74) *Attorney, Agent, or Firm* — Morgan, Lewis & Bockius LLP

(57) ABSTRACT

An image sensor includes: a chip structure including normal pixels and auto focus pixels; a grid structure disposed on the chip structure; and color filter regions defined by the grid structure over the chip structure. The color filter regions include normal filter regions and auto focus filter regions. The normal filter regions correspond to the normal pixels. The chip structure includes a first region at a first distance, and a second region a second distance greater than the first distance. The auto focus filter regions include a first auto focus filter region on the first region and a second auto focus filter region on the second region. A first width of a first grid portion disposed adjacent the first auto focus filter region among the grid structure is narrower than a second width of a second grid portion disposed adjacent the second auto focus filter region among the grid structure.

17 Claims, 13 Drawing Sheets

(56) References Cited

U.S. PATENT DOCUMENTS

| | | | | |
|---|---|---|---|---|
| 2019/0052823 | A1* | 2/2019 | Jung | H10F 39/8023 |
| 2020/0177829 | A1* | 6/2020 | Takahashi | H10F 39/18 |
| 2020/0387050 | A1* | 12/2020 | Pyo | H04N 23/672 |
| 2021/0120198 | A1* | 4/2021 | Kim | H04N 25/11 |
| 2021/0358985 | A1* | 11/2021 | Lin | H10F 39/807 |
| 2022/0149091 | A1 | 5/2022 | Joe et al. | |
| 2022/0149097 | A1 | 5/2022 | Li et al. | |
| 2022/0173138 | A1 | 6/2022 | Yang et al. | |
| 2022/0181370 | A1 | 6/2022 | Lin et al. | |
| 2022/0190017 | A1 | 6/2022 | Park et al. | |
| 2022/0408042 | A1* | 12/2022 | Tanaka | H04N 25/46 |

FOREIGN PATENT DOCUMENTS

| | | |
|---|---|---|
| KR | 10-0988779 | 10/2010 |
| KR | 10-2011-0079336 | 7/2011 |
| KR | 10-2019-0017197 | 2/2019 |

* cited by examiner

IMAGE SENSOR

CROSS-REFERENCE TO RELATED APPLICATION(S)

This U.S. patent application claims priority under 35 U.S.C. 119(a) to Korean Patent Application No. 10-2022-0168873 filed on Dec. 6, 2022, in the Korean Intellectual Property Office, the disclosure of which is incorporated by reference in its entirety herein.

1. Technical Field

The present disclosure relates to an image sensor.

2. Discussion of Related Art

An image sensor is a semiconductor-based sensor which receives light and generates a electrical signal based on the received light. Examples of the image sensor include a charge-coupled device (CCD) sensor and a complementary metal-oxide-semiconductor (CMOS) sensor.

The image sensor may include a pixel array having a plurality of pixels and a logic circuit for driving the pixel array and generating an image. Each of the plurality of pixels may include a photodiode and a pixel circuit for converting electric charges generated in the photodiode into the electrical signal. Some of the pixels may additionally provide an auto focus function. However, a cross-talk phenomenon may occur that causes degradation of the auto focus function.

SUMMARY

An aspect of the present disclosure may provide an image sensor having increased auto focusing characteristics.

According to an aspect of the present disclosure, an image sensor includes: a chip structure, a grid structure, and color filter regions. The chip structure includes normal pixel regions (e.g., normal pixels) and auto focus pixel regions (e.g., auto focus pixels). The grid structure is disposed on the chip structure. The color filter regions are defined by the grid structure over the chip structure. The color filter regions include normal filter regions and auto focus filter regions. The normal filter regions correspond to the normal pixel regions. One auto focus filter region among the auto focus filter regions corresponds to at least two auto focus pixel regions disposed adjacent to each other among the auto focus pixel regions. The chip structure include a first region spaced from a central region of a pixel array region of the chip structure by a first distance, and a second region spaced from the central region of the pixel array region of the chip structure by a second distance greater than the first distance. The auto focus filter regions include a first auto focus filter region disposed on the first region and a second auto focus filter region disposed on the second region. A first width of a first grid portion disposed adjacent to the first auto focus filter region among the grid structure is narrower than a second width of a second grid portion disposed adjacent to the second auto focus filter region among the grid structure.

According to an aspect of the present disclosure, an image sensor includes: a chip structure, a grid structure, and color filter regions. The chip structure includes normal pixel regions and auto focus pixel regions. The grid structure is disposed on the chip structure. The color filter region are defined by the grid structure over the chip structure. The color filter regions including normal filter regions and auto focus filter regions. The normal filter regions correspond to the normal pixel regions. One auto focus filter region among the auto focus filter regions corresponds to at least two auto focus pixel regions disposed adjacent to each other among the auto focus pixel regions. The chip structure includes a first region spaced from a central region of a pixel array region of the chip structure by a first distance, and a second region spaced from the central region of the pixel array region of the chip structure by a second distance greater than the first distance. The auto focus filter regions include a first auto focus filter region disposed on the first region and a second auto focus filter region disposed on the second region. A first length of the first auto focus filter region in a first horizontal direction is shorter than a second length of the second auto focus filter region in the first horizontal direction.

According to an aspect of the present disclosure, an image sensor includes: a first chip structure, a second chip structure, a grid structure, color filter regions, and micro lens regions. The first chip structure includes a first substrate and a first circuit element disposed on the first substrate. The second chip structure is disposed on the first chip structure, and includes a second substrate including normal pixel regions and auto focus pixel regions and a second circuit device between the second substrate and the first chip structure. The grid structure is disposed on the second chip structure. The color filter regions are defined by the grid structure over the second chip structure. The micro lens regions are disposed on the color filter regions. The color filter regions include normal filter regions and auto focus filter regions. The normal filter regions correspond to the normal pixel regions. One auto focus filter region among the auto focus filter regions corresponds to at least two auto focus pixel regions disposed adjacent to each other among the auto focus pixel regions. The second chip structure includes a first region spaced from a central region of a pixel array region of the second chip structure by a first distance, and a second region spaced from the central region of the pixel array region of the chip structure by a second distance greater than the first distance. The auto focus filter regions include a first auto focus filter region disposed on the first region and a second auto focus filter region disposed on the second region. A first width of a first grid portion defining a side surface of the first auto focus filter region in a first horizontal direction among the grid structure is narrower than a second width of a second grid portion defining a side surface of the second auto focus filter region in the first horizontal direction among the grid structure.

The present disclosure may provide an image sensor with increased auto focus characteristics by providing a grid structure formed to increase a width of a grid portion near the auto focus pixel region as it moves away from a central region of the pixel array region. However, effects of the present application are not limited thereto.

BRIEF DESCRIPTION OF DRAWINGS

The above and other aspects and features of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings. Hereinafter, it may be understood that the expressions such as "on," "above," "upper," "below," "beneath," "lower," and "side," merely indicated based on drawings, except that they are indicated by drawings and referred to separately. Terms such as "upper," "immediate," and "lower" may be replaced with other terms such as "first," "second," and "third" and be used to describe components of the present disclosure. The terms such as "first," "second," and "third" may be used to describe various components, but the components are not limited thereto, and a "first component" may be referred to as a "second component."

Figure 1:
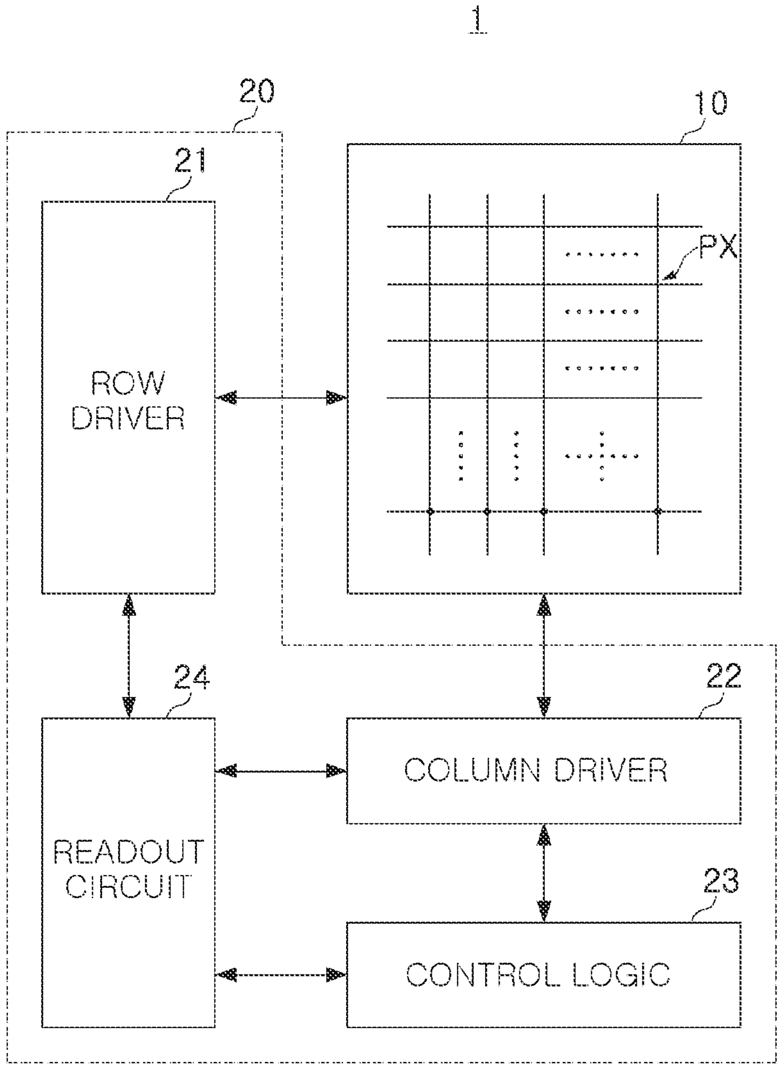
FIG. 1 is a block diagram schematically illustrating an image sensor according to an example embodiment.

FIG. 1 is a block diagram schematically illustrating an image sensor according to an example embodiment.

Referring to FIG. 1, an image sensor 1 may include a pixel array 10 and a logic circuit 20.

The pixel array 10 may include a plurality of pixels PX arranged in an array form along a plurality of rows and a plurality of columns. Each of the plurality of pixels PX may include at least one photoelectric conversion element for generating an electric charge in response to light, and a pixel circuit for generating a pixel signal corresponding to the electric charge generated by the photoelectric conversion element. The photoelectric conversion device may include a photodiode formed of a semiconductor material, and/or an organic photodiode formed of an organic material.

In an example embodiment, the pixel circuit may include a floating diffusion, a transmission transistor, a reset transistor, a driving transistor, a select transistor, and the like. The configuration of the plurality of pixels PX may vary according to example embodiments. For example, each of the plurality of pixels PX may include an organic photodiode including an organic material, or may be implemented as digital pixels. When the plurality of pixels PX are implemented as the digital pixels, each of the pixels PX may include an analog-to-digital converter for outputting a digital pixel signal.

The logic circuit 20 may include circuits for controlling the pixel array 10. For example, the logic circuit 20 may include a row driver 21 (e.g., a row driver circuit), a readout circuit 22, a column driver 23 (e.g., a column driver circuit), and a control logic 24 (e.g., a logic circuit). The row driver 21 may drive the pixel array 10 in units of row lines. For example, the row driver 21 may generate a transmission control signal for controlling the transmission transistor of the pixel circuit, a reset control signal for controlling the reset transistor, and a select control signal for controlling the select transistor and input these signals into the pixel array 10 in units of row lines.

The readout circuit 22 may include a correlated double sampler (CDS) and an analog-to-digital converter (ADC). The correlated double samplers may be connected to the plurality of pixels PX through column lines. The correlated double samplers may read a pixel signal through the column lines from a pixel PX connected to a row line selected by a row line select signal of the row driver 21. The analog-to-digital converter may convert the pixel signal detected by the correlated double sampler into a digital pixel signal and transmit the digital pixel signal to the column driver 23.

The column driver 23 may include a latch or a buffer circuit and an amplification circuit configured to temporarily store a digital pixel signal, and may process the digital pixel signal received from the readout circuit 22. The row driver 21, the readout circuit 22, and the column driver 23 may be controlled by the control logic 24. The control logic 24 may include a timing controller for controlling operation timings of the row driver 21, the readout circuit 22, and the column driver 23.

Pixels PX disposed at the same position in a horizontal direction among the plurality of pixels PX may share the same column line. For example, pixels PX disposed at the same position in a vertical direction among a plurality of pixels PX may be simultaneously selected by the row driver 21 and may output pixel signals through the column lines. For example, the readout circuit 22 may simultaneously obtain the pixel signals from the plurality of pixels PX selected by the row driver 21 through the column lines. The pixel signal may include a reset voltage and a pixel voltage, and the pixel voltage may be a voltage at which electric charges generated in response to light in each of the plurality of pixels PX are reflected in the reset voltage.

Figure 2A:
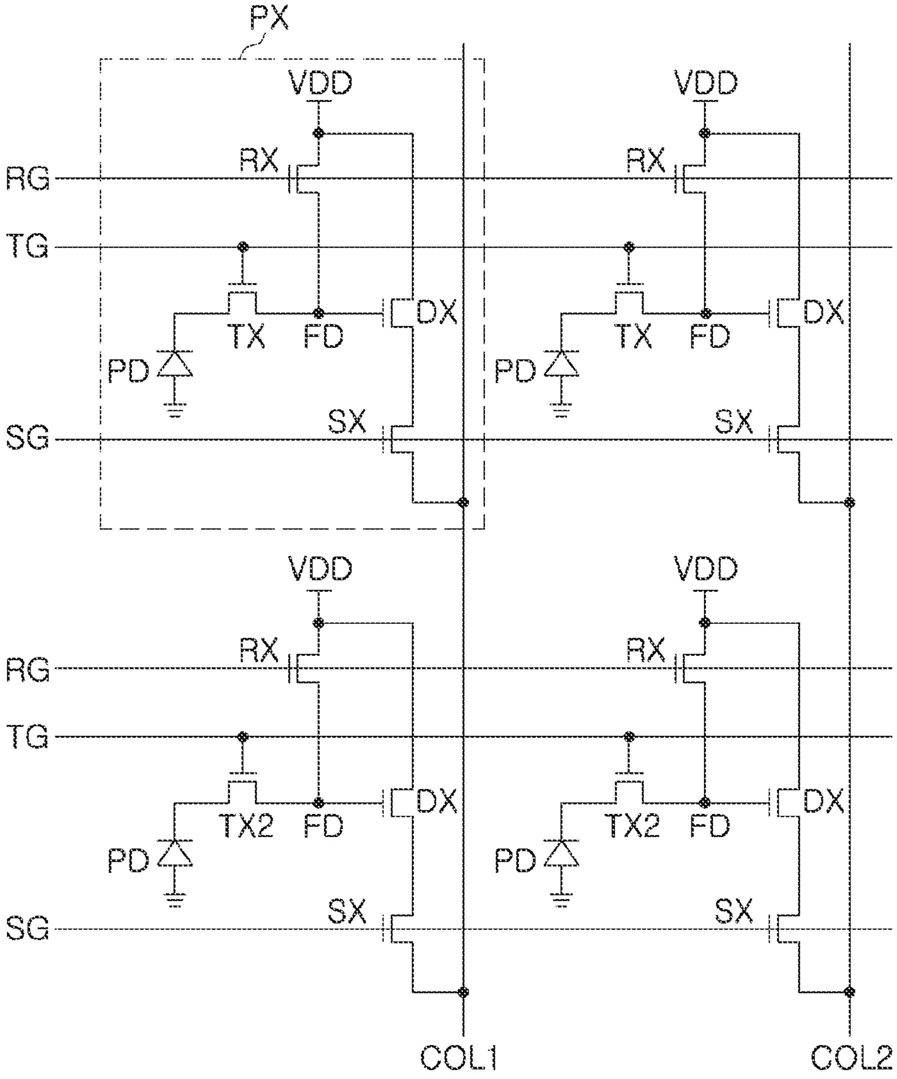
FIGS. 2A and 2B are diagrams illustrating exemplary examples of a pixel circuit of an image sensor according to an example embodiment of the present disclosure.
Figure 2B:
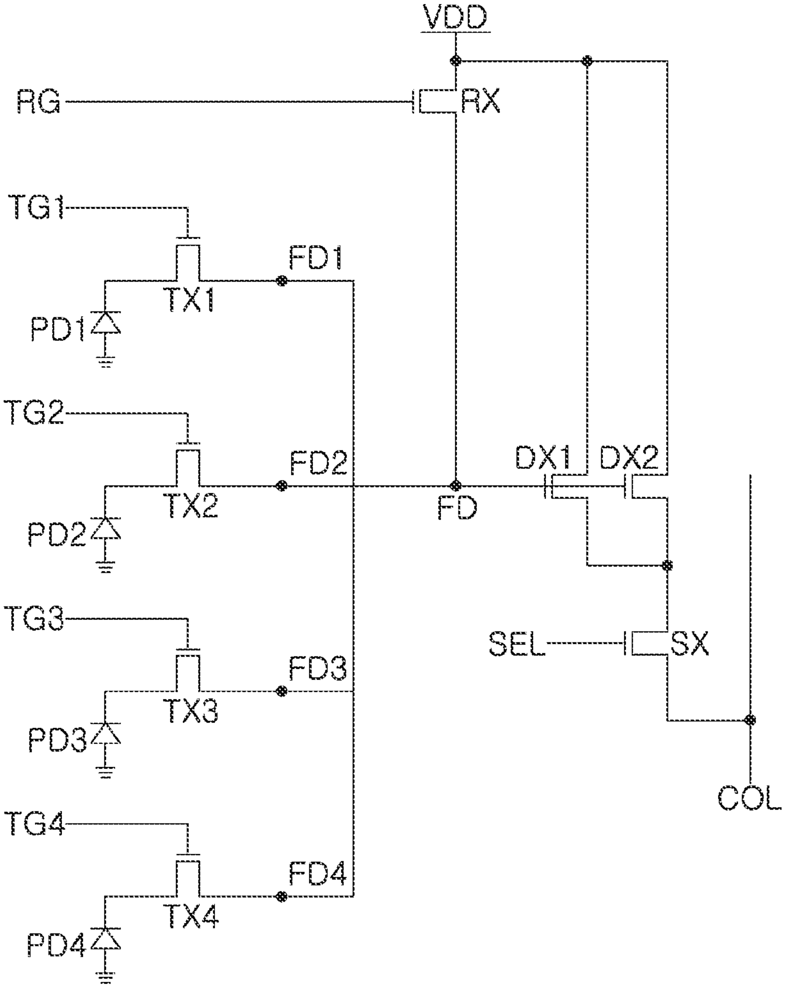

FIGS. 2A and 2B are diagrams illustrating exemplary examples of a pixel circuit of an image sensor according to an example embodiment of the present disclosure. Various examples of pixel circuits of the image sensor according to an example embodiment of the present disclosure will be described with reference to FIGS. 2A and 2B, respectively.

In an example embodiment, referring to FIGS. 1 and 2A, each of the pixels PX may include a photodiode PD and a pixel circuit, and the pixel circuit may include a transmission transistor TX, a reset transistor RX, a select transistor SX, and a driving transistor DX.

The photodiode PD may generate and accumulate the electric charges in response to light incident from the outside. The pixel circuit may further include a floating diffusion region FD in which the electric charges generated from the photodiode PD are accumulated.

The photodiode PD may be replaced with a phototransistor, a photogate, or a pinned photodiode according to example embodiments. In the present disclosure, the photodiode PD may be referred to and described as an "optical conversion element." The photoelectric conversion element may include a photo diode, a photo transistor, a photo gate, or a pinned photo diode.

The transmission transistor TX may transfer the electric charges generated from the photodiode PD to the floating diffusion region FD. The floating diffusion region FD may store the electric charges generated from the photodiode PD. A voltage output by the driving transistor DX may vary depending on the amount of electric charges accumulated in the floating diffusion region FD.

The reset transistor RX may reset a voltage of the floating diffusion region FD by removing the electric charges accumulated in the floating diffusion region FD. A drain electrode of the reset transistor RX may be connected to the floating diffusion region FD, and a source electrode may be connected to a power voltage VDD. When the reset transistor RX is turned on, the power voltage VDD connected to the source electrode of the reset transistor RX is applied to the floating diffusion region FD, and electric charges accumulated in the floating diffusion region FD may be removed.

The driving transistor DX may operate as a source follower buffer amplifier. The driving transistor DX may amplify a voltage change of the floating diffusion region FD and output the amplified voltage change to one of the column lines COL1 and COL2. The select transistor SX may select pixels PX to be read in units of rows. When the select transistor SX is turned on, a voltage of the driving transistor DX may be output to one of the column lines COL1 and COL2. When the select transistor SX is turned on, the reset voltage or the pixel voltage may be output through the column lines COL1 and COL2.

In an example embodiment illustrated in FIG. 2A, each of the pixels PX may include not only the photodiode PD and the transmission transistor TX, but also the reset transistor RX, the select transistor SX, and the driving transistor DX, but the present disclosure is not limited thereto and may be modified as illustrated in FIG. 2B.

In a modified example embodiment, referring to FIGS. 1 and 2B, two or more pixels PX disposed adjacent to each other may share at least a portion of transistors included in the pixel circuit. For example, four pixels disposed adjacent to each other may share the reset transistor RX, first and second driving transistors DX1 and DX2, and the select transistor SX with one floating diffusion region FD.

In an example embodiment, a first photodiode PD1 and a first transmission transistor TX1 of a first pixel may be connected to the floating diffusion region FD. Similarly, second to fourth photodiodes PD2 to PD4 of second to fourth pixels may be connected to the floating diffusion region FD through second to fourth transmission transistors TX2 to TX4.

As one example, the floating diffusion regions FD included in each of the pixels may be connected to each other by a wiring pattern, and the first to fourth transmission transistors TX1 to TX4 may be commonly connected to one floating diffusion region FD.

As another example, the floating diffusion regions FD included in each of the pixels may form one region in a substrate that may be formed of a semiconductor material.

The pixel circuit may include the reset transistor RX, the first and second driving transistors DX1 and DX2, and the select transistor SX. The reset transistor RX may be controlled by a reset control signal RG, and the select transistor SX may be controlled by a select control signal SEL. For example, each of the four pixels may further include one transistor in addition to the transmission transistor TX. Two of the four transistors included in the four pixels may be connected to each other in parallel to supply the first and second driving transistors DX1 and DX2, one of the remaining two transistors may be supplied as the select transistor SX, and the other thereof may be supplied as the reset transistor RX.

The pixel circuit described with reference to FIG. 2B is only an example embodiment, and is not necessarily limited to the example embodiment. For example, one of the four transistors may be assigned to the driving transistor and another may be assigned to a select transistor. Furthermore, the other two transistors may be connected in series to each other and assigned to first and second reset transistors, thereby implementing an image sensor configured to adjust a conversion gain of the pixel. Furthermore, the pixel circuit may vary according to the number of transistors included in each of the pixels. As described above, the pixel circuits described with reference to FIGS. 2A and 2B are exemplary examples for implementing the image sensor according to an example embodiment of the present disclosure, and the present disclosure is not limited thereto.

Figure 3:
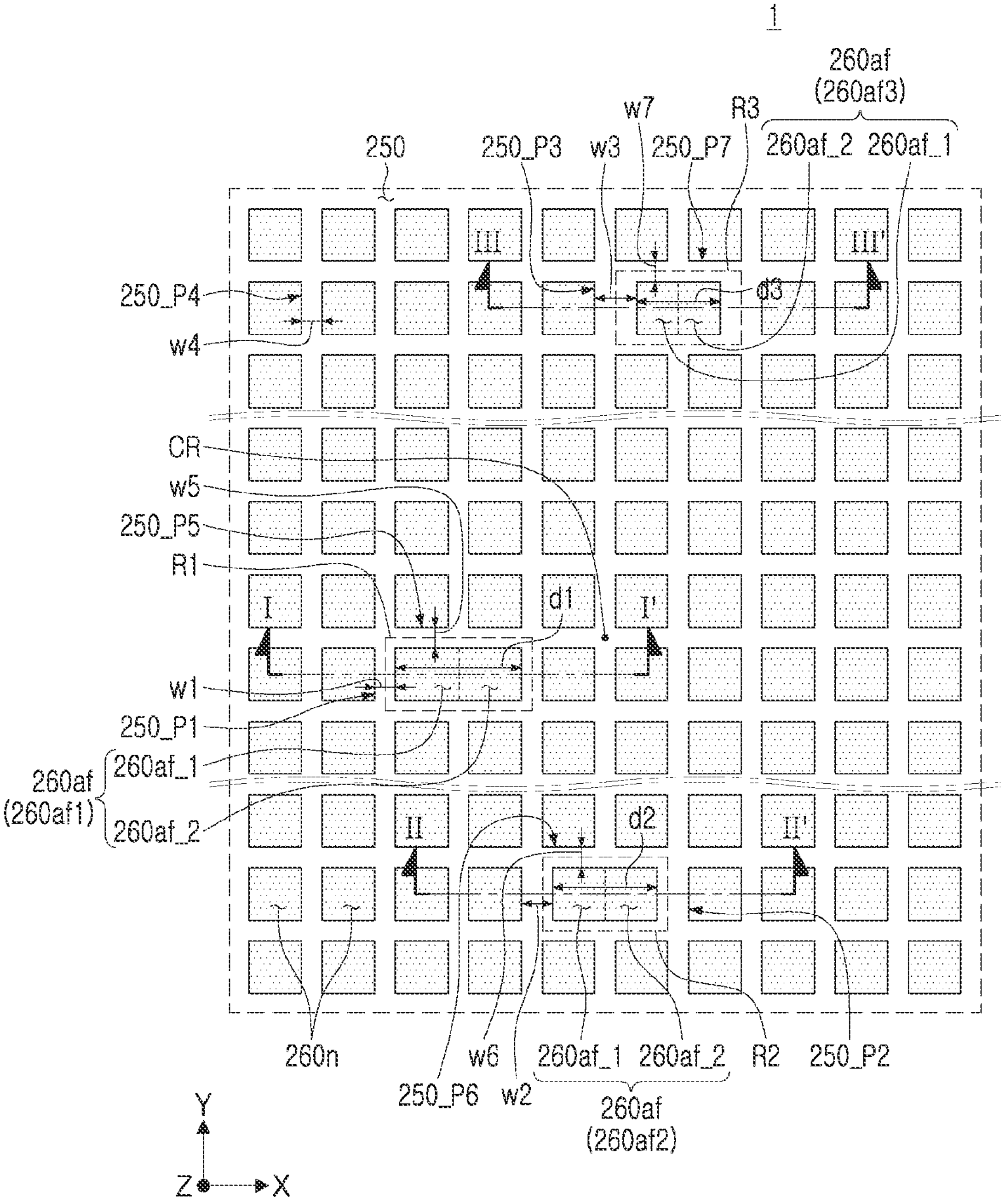
FIG. 3 is a top plan view illustrating an image sensor according to an example embodiment.

FIG. 3 is a top plan view illustrating an image sensor according to an example embodiment. FIG. 3 is a top plan view of a level at which a grid structure 250 is disposed.

Figure 4:
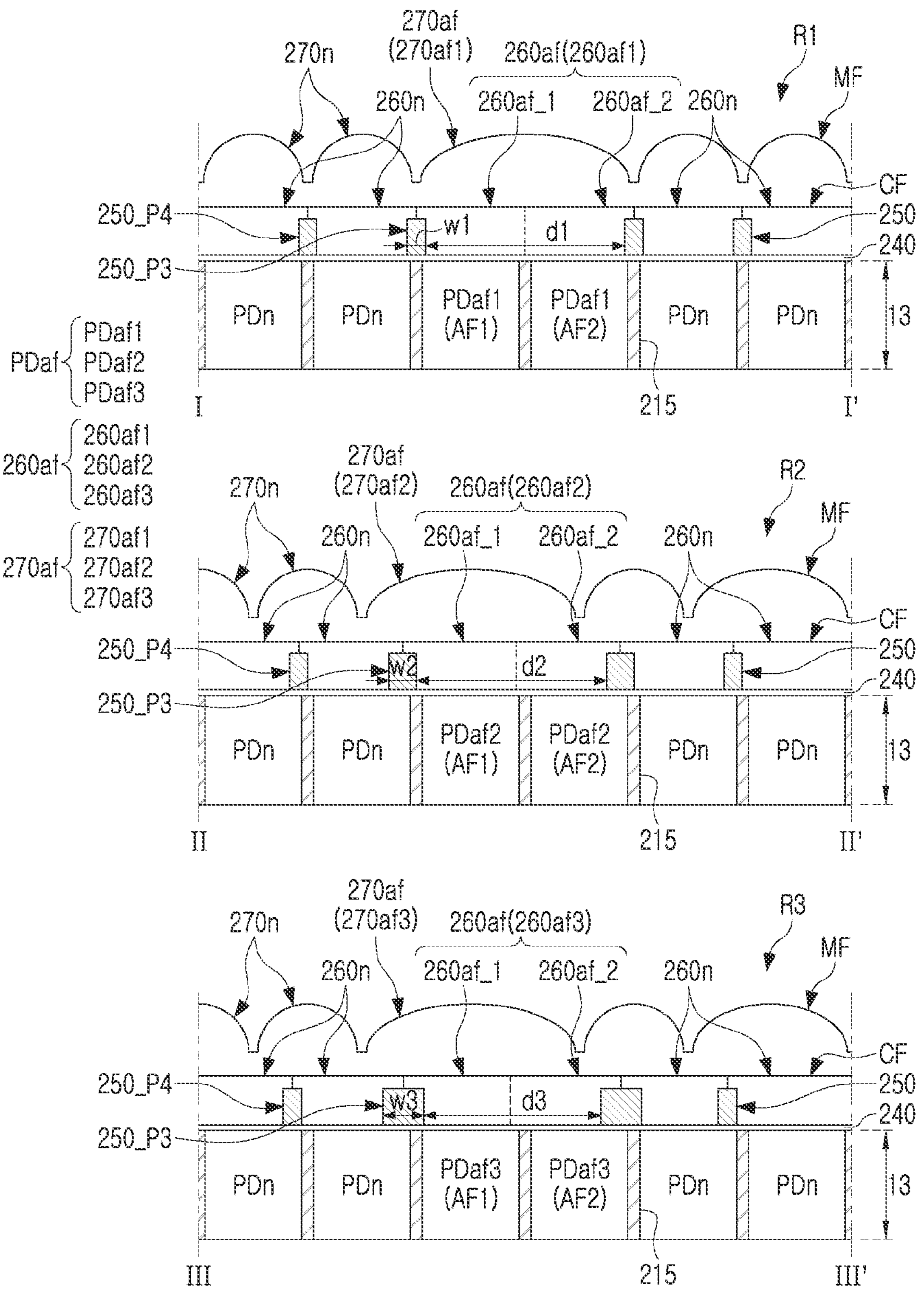
FIG. 4 is cross-sectional views illustrating an image sensor according to an example embodiments.

FIG. 4 is cross-sectional of a view illustrating an image sensor according to an example embodiment. FIG. 4 is a cross-sectional view schematically illustrating regions taken along lines I-I', II-II' and III-III' of FIG. 3.

Referring to FIGS. 3 and 4, the image sensor 1 according to an example embodiment includes a chip structure 13, an insulating structure 240 disposed on the chip structure 13, the grid structure 250 and color filters CF over the insulating structure 240, and micro lenses MF disposed over the color filters CF. The chip structure 13 may include the plurality of pixels PX and the logic circuit 20 described with reference to FIGS. 1 to 2B.

The chip structure 13 may have pixel regions PDn and PDaf. The pixel regions PDn are normal pixel regions and the pixel regions PDaf are auto focus pixel regions. For example, the normal pixel regions may include normal pixels and the auto focus pixel regions may include auto focus pixels. Each of the auto focus pixel regions PDaf may be pixel regions configured to perform an auto focusing function. The normal pixel regions PDn may refer to the remaining pixel regions except the auto focus pixel regions PDaf. The normal pixel regions PDn may be, for example, regions including the photodiode PD described in FIGS. 1 to 2B, and may be spaced from each other. At least a portion of the normal pixel regions PDn may be dummy pixel regions. In an embodiment, the dummy pixel regions do not sense light.

The chip structure 13 may further include a separation structure 215 (e.g., separation layers) defining the pixel regions PDn and PDaf. Each of the normal pixel regions PDn, each of the auto focus pixel regions PDaf, and the normal pixel regions PDn and the auto focus pixel regions PDaf may be spaced from each other by the separation structure 215. The separation structure 215 may be disposed to surround each of the pixel regions PDn and PDaf. In an embodiment, the separation structure 215 includes or is an insulating material, and the number of layers constituting the separation structure 215 may be variously changed.

The insulating structure 240 may be formed to have a conformal thickness on the chip structure 13. The insulating structure 240 may include an antireflection layer configured to prevent reflection of light that may be caused by a sudden change in a refractive index on a surface of the chip structure 13. The insulating structure 240 may include an antireflection layer that may provide light incident by adjusting the refractive index so that light is emitted from the pixel regions PDn and PDaf with a high transmittance. The insulating structure 240 may be referred to as an antireflection structure or an antireflection layer. The number of layers constituting the insulating structure 240 may be variously changed.

The grid structure 250 may be disposed on the insulating structure 240. The grid structure 250 may include an insulating material or a conductive material of the grid structure 250 on the insulating structure 240. For example, the grid structure 250 may include a first layer including at least one of a metal such as Ti, Ta and W, or a metal nitride such as TiN and TaN, and a second layer including a low refractive index (LRI) material (e.g., an oxide or nitride including Si, Al Ehsms, or combinations thereof, an silicon oxide having a porous structure, or silica nanoparticles having a network structure). However, the material constituting the grid structure 250 and the number of layers constituting the grid structure 250 may be variously changed.

The color filters CF may be disposed over the insulating structure 240. The color filters CF may allow light at a specific wavelength to pass and reach the pixel regions PDn and PDaf. The color filters CF may include color filters of different colors. For example, each of the color filters CF may be one of a green color filter, a blue color filter, and a red color filter.

The color filters CF may include color filter regions 260 defined by the grid structure 250. The color filter regions 260 may include normal filter regions 260*n* corresponding to the normal pixel regions PDn and auto focus filter regions 260*af* corresponding to the auto focus pixel regions PDaf.

As one example, one normal filter region 260*n* of the normal filter regions 260*n* may correspond to N normal pixel regions, and one auto focus filter region 260*af* of the auto focus filter regions 260*af* may correspond to at least M auto focus pixel regions disposed adjacent to each other. N and M may be different natural numbers, and M may be greater than N. For example, each of the normal filter regions 260*n* may correspond to one normal pixel region PDn, and each of the auto focus pixel regions 260*af* may correspond to two adjacent auto focus pixel regions PDaf (e.g., first and second phase difference detection regions AF1 and AF2). In an embodiment, each of the auto focus filter regions 260*af* may have a form in which a first portion 260*af*_1 corresponding to the first phase difference detection region AF1 and a second portion 260*af*_2 corresponding to the second phase difference detection region AF2 are integrally connected to each other. In an embodiment, the first portion 260*af*_1 includes the same color filter as the second portion 260*af*_2. The color filter may be, for example, a green filter. The grid structure 250 may surround external sides of the first portion 260*af*_1 and the second portion 260*af*_2 without being disposed between the first portion 260*af*_1 and the second portion 260*af*_2.

In an example embodiment, the color filter regions 260 have a portion extending onto an upper surface of the grid structure 250. For example, the color filter regions 260 may extend on the upper surface of the grid structure 250. Accordingly, the upper surface of each of the color filters CF may be disposed at a higher level than the upper surface of the grid structure 250.

The micro lenses MF may be disposed on the color filters CF. Each of the micro lenses ML may have a convex shape in a direction moving away from the chip structure 13. The micro lenses ML may concentrate incident light to the pixel regions PDn and PDaf. The micro lenses ML may be formed of a transparent photoresist material or a transparent thermosetting resin material. For example, the micro lenses (ML) may be formed of a TMR-based resin (produced by Tokyo Ohka Kogo, Co.) or an MFR-based resin (produced by Japan Synthetic Rubber Corporation), but the present disclosure is not limited to these materials.

The micro lenses MF may include micro lens regions 270 corresponding to each of the color filter regions 260. The micro lens regions 270 may include normal lens regions 270*n* corresponding to the normal filter regions 260*n* and auto focus lens regions 270*af* corresponding to the auto focus filter regions 260*af*. In an exemplary embodiment, each of the normal lens regions 270*n* correspond to one normal filter region 260*n*, and each of the auto focus lens regions 270*af* correspond to one auto focus filter region 260*af*. In an embodiment, a size or area of each of the normal lens regions 270*n* is smaller than a size or area of each of the auto focus lens regions 270*af*. For example, a first length of each of the normal lens regions 270*n* in an X-direction may be shorter than a second length of each of the auto focus lens regions 270*af* in the X-direction. The second length may be in a range between about 1.5 times and about 2.5 times greater than the first length. This may be because the first length is a length of a region corresponding to one normal pixel region PDaf, and the second length is a length of a region corresponding to two auto focus pixel regions PDaf (e.g., the first and second phase difference detection regions AF1 and AF2).

In an example embodiment, the auto focus pixel regions PDaf includes a first phase difference detection region AF1 and a second phase difference detection region AF2 disposed adjacent to each other in a first horizontal direction, for example, in the X-direction. The first phase difference detection region AF1 and the second phase difference detection region AF2 may form an auto focus group, as one unit for performing an auto focus function. In an embodiment, the automatic focus function is performed using a sensitivity difference between the first phase difference detection region AF1 and the second phase difference detection region AF2. For example, the auto focus function may be performed using the sensitivity difference between the first and second phase difference detection regions AF1 and AF2 according to light incident at a certain angle with the first horizontal direction. Performance of the auto focus function may increase with an increase in the sensitivity difference between the first and second phase difference detection regions AF1 and AF2. The first chip structure 13 may include a plurality of auto focus groups, and each of the auto focus groups may be surrounded by the normal pixel regions PDn on a plane.

In an example embodiment, the chip structure 13 includes a first region R1 spaced from a central region CR of the pixel array region of the chip structure 13 by a first distance, a second region R2 spaced from the central region CR of the pixel array region of the chip structure 13 by a second distance, and a third region R3 spaced from the central region CR of the pixel array region of the chip structure 13 by a third distance greater than the second distance. In the present specification, each of the first to third regions R1, R2 and R3 may refer to a region in a predetermined range including a portion spaced from the central region CR of the pixel array region of the chip structure 13 by the first to third distances. The central region CR may be disposed at a center of the pixel array region. The auto focus pixel regions PDaf may include a first auto focus group including first auto focus pixel regions PDaf1 disposed in the first region R1, a second auto focus group including second auto focus pixel regions PDaf2 disposed in the second region R2, and a third auto focus group including third auto focus pixel regions PDaf3 disposed in the third region R3. Each of the first to third auto focus groups may perform the auto focus function. However, directions of light incident to perform the automatic focus function may be different from each other in the first to third regions R1, R2 and R3. This may be because light is incident toward the chip structure 13 from a point-shaped light source disposed above a Z-direction perpendicular to the central region CR of the pixel array region of the chip structure 13.

The auto focus filter regions 260*af* may include a first auto focus filter region 260*af*1 disposed on the first region R1, a second auto focus filter region 260*af*2 disposed on the second region R2, and a third auto focus filter region 260*af*3 disposed on the third region R3. In an example embodiment, the first auto focus filter region 260*af*1 corresponds to the first auto focus group, the second auto focus filter region 260*af*2 corresponds to the second auto focus group, and the third auto focus filter region 260*af*3 corresponds to the third auto focus group.

The auto focus lens regions 270*af* may include a first auto focus lens region 270*af*1 disposed on the first region R1, a second auto focus lens region 270*af*2 disposed on the second region R2, and a third auto focus lens region 270*af*3 disposed on the third region R3. In an example embodiment, the first auto focus lens region 270*af*1 corresponds to the first auto focus filter region 260*af*1, the second auto focus lens region 270*af*2 may correspond to the second auto focus filter region 260*af*2, and the third auto focus lens region 270*af*3 corresponds to the third auto focus filter region 260*af*3.

The grid structure 250 may include a first grid portion 250_P1 disposed adjacent to the first auto focus filter region 260*af*1, a second grid portion 250_P2 disposed adjacent to the second auto focus filter region 260*af*2, and a third grid portion 250_P3 disposed adjacent to the third auto focus filter region 260*af*3.

In an exemplary embodiment, the first grid portion 250_P1 is a region defining at least a portion of side surfaces of the first auto focus filter region 260*af*1, for example, a side surface in the X-direction, the second grid portion 250_P2 is a region defining at least a portion of side surfaces of the second auto focus filter region 260*af*2, for example, a side surface in the X-direction, and the third grid portion 250_P3 is a region defining at least a portion of side surfaces of the third auto focus filter region 260*af*3, for example, a side surface in the X-direction.

In an exemplary embodiment, the first grid portion 250_P1 is a portion of the grid structure 250 disposed between the first auto focus filter region 260*af*1 and the normal filter region 260*n* disposed adjacent to the first auto focus filter region 260*af*1 in the X-direction, the second grid portion 250_P2 is a portion of the grid structure 250 disposed between the second auto focus filter region 260*af*2 and the normal filter region 260*n* disposed adjacent to the second auto focus filter region 260*af*2 in the X-direction, and the third grid portion 250_P3 is a portion of the grid structure 250 disposed between the third auto focus filter region 260*af*3 and the normal filter region 260*n* disposed adjacent to the third auto focus filter region 260*af*3 in the X-direction.

In an embodiment, a first width w1 of the first grid portion 250_P1 is narrower or smaller than a second width w2 of the second grid portion 250_P2, and the second width w2 of the second grid portion 250_P2 is narrower or smaller than a third width w3 of the third grid portion 250_P3. The first width w1 may be defined as a distance between the first portion 260*af*_1 of the first auto focus filter region 260*af*1 and the normal filter region 260*n* disposed adjacent to the first portion 260*af*_1 in the X-direction, or a distance between the second portion 260*af*_2 of the first auto focus filter region 260*af*1 and the normal filter region 260*n* disposed adjacent to the second portion 260*af*_2 in the X-direction.

When light is incident to perform the auto focus function, a cross talk phenomenon may occur in which light incident on the normal filter region 260*n* disposed adjacent to the auto focus filter region 260*af* enters an auto focus pixel region PDaf corresponding to the auto focus filter region 260*af*. Due to such a crosstalk phenomenon, a sensitivity difference between the first and second phase difference detection regions AF1 and AF2 may be reduced to deteriorate the auto focus function. With an increase in the width of the grid structure 250 disposed between the auto focus filter region 260*af* and the normal filter region 260*n*, the cross talk phenomenon may be reduced, but the amount of light incident into the pixel regions PDn and PDaf may deteriorate.

The directions of the light incident to perform the auto focus function may be different from each other in the first to third regions R1, R2 and R3, and the cross talk phenomenon may increase toward a region far from the central portion CR of the pixel array region of the chip structure 13. As the widths of the grid structures 250 on the first to third regions R1, R2, and R3 are differently adjusted, the cross talk phenomenon may be reduced, and the image sensor 1 having the auto focus function with an increased performance or quality may be provided. For example, the second grid portion 250_P2 having the second width w2 greater than the first width w1 of the first grid portion 250_P1 may be provided on the second region R2 farther than the first region R1, thereby increasing performance or quality of the auto focus function of each of the auto focus groups as a whole.

The grid structure 250 may include a fourth grid portion 250_P4 between the adjacent normal filter regions 260*n*, and the fourth grid portion 250_P4 has a fourth width w4. In an embodiment, the fourth width w4 is narrower or smaller than at least one of the first to third widths w1, w2 and w3. In an exemplary embodiment, the fourth width w4 is identical to or substantially identical to the first width w1 and is illustrated as being narrower or smaller than the second width w2 and the third width w3, but is not limited thereto as described below in FIG. 5.

In an exemplary embodiment, the grid structure 250 includes a fifth grid portion 250_P5 disposed between the first auto focus filter region 260*af*1 and the normal filter region 260*n* disposed adjacent to the first auto focus filter region 260*af*1 in a Y-direction, a sixth grid portion 250_P6 disposed between the second auto focus filter region 260*af*2 and the normal filter region 260*n* disposed adjacent to the second auto focus filter region 260*af*2 in the Y-direction, and a seventh grid portion 250_P7 disposed between the third auto focus filter region 260*af*3 and the normal filter region 260*n* disposed adjacent to the third auto focus filter region 260*af*3 in the Y-direction. The fifth grid portion 250_P5 may have a fifth width w5, the sixth grid portion 250_P6 may have a sixth width w6, and the seventh grid portion 250_P7 may have a seventh width w7. In an exemplary embodiment, the fifth width w5, the sixth width w6, and the seventh width w7 are identical to or substantially identical to each other, but may be different from each other as described below in FIG. 6.

In an exemplary embodiment, on a plane, a first distance misaligned between a central region of the first auto focus filter region 260*af*1 and a central region of the second auto focus lens region 270*af*1 is shorter than a second distance misaligned between a central region of the second auto focus filter region 260*af*2 and a central region of the second auto focus lens region 270*af*2. In an embodiment, the second distance is shorter than a third distance misaligned between a central region of the third auto focus filter region 260*af*3 and a central region of the third auto focus lens region 270*af*3. This may be because the directions of light incident to perform the automatic focus function are different from each other in the first to third regions R1, R2 and R3, as described above.

In an example embodiment, a first length d1 of the first auto focus filter region 260*af*1 in the X-direction is longer than a second length d2 of the second auto focus filter region 260*af*2 in the X-direction, and the second length d2 is longer than a third length d3 of the third auto focus filter region 260*af*3. This may be because the first to third grid portions 250_P1, 250_P2 and 250_P3 are formed to adjust the size of the auto focus filter regions 260*af* while uniformly maintaining the size of the adjacent normal filter regions 250*n* as illustrated in FIG. 3. However, the sizes of the auto focus filter regions 260*af* and the normal filter regions 250*n* disposed adjacent thereto may be variously changed as described below in FIGS. 8 to 10.

Next, various modifications of an image sensor according to example embodiments will be described with reference to FIGS. 5 to 10. Various modified examples of components of the image sensor to be described below will be described centering on modified components or replaced components. In addition, the modified or replaceable components described below are described with reference to each drawing, but the modified components may be combined to form an image sensor according to example embodiments of the present disclosure.

FIGS. 5 to 10 are top plane views illustrating image sensors according to example embodiments.

Figure 5:
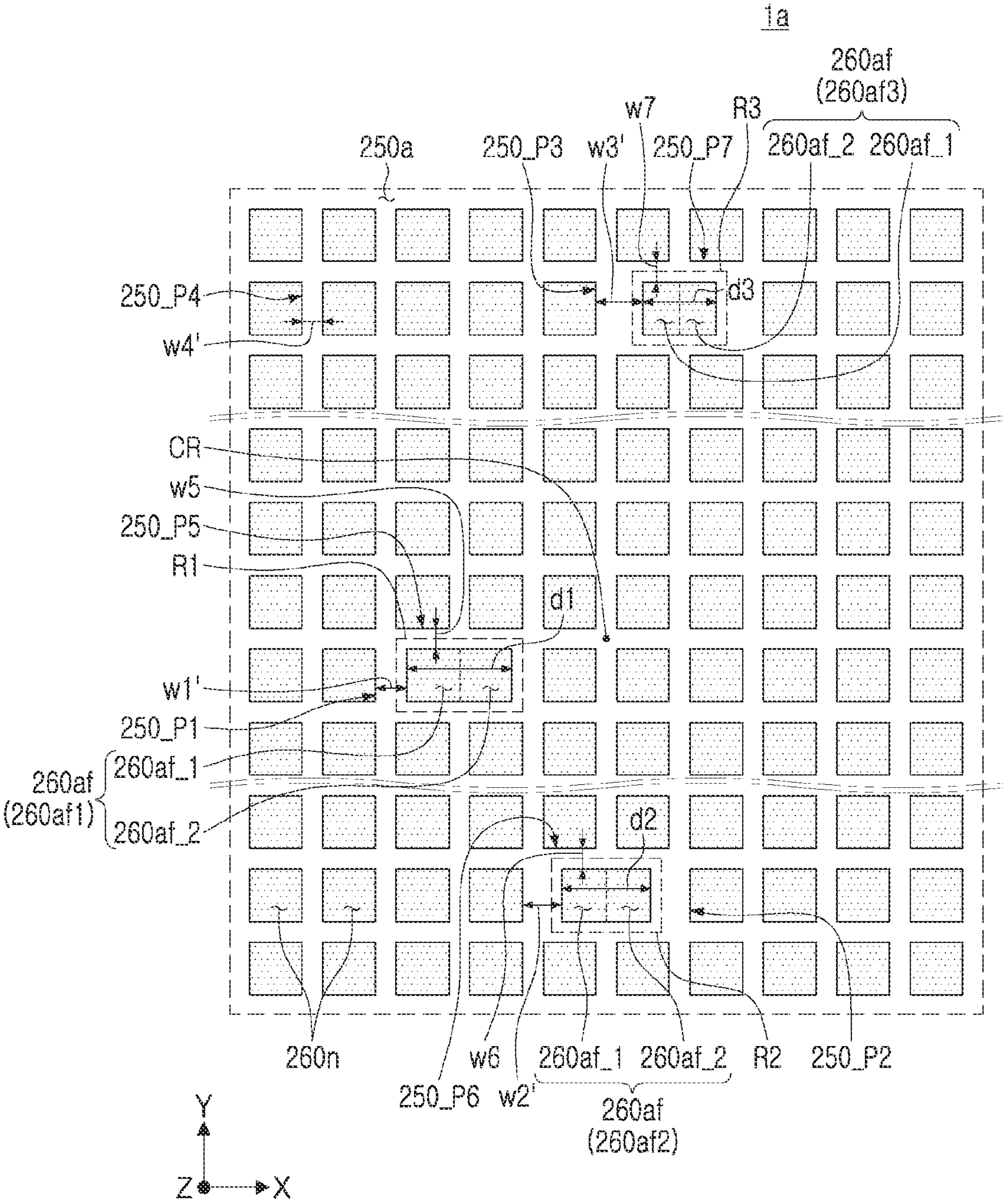
FIG. 5 is a top plan view illustrating an image sensor according to example embodiments.

Referring to FIG. 5, in an image sensor 1*a*, a first width w1' of the first grid portion 250_P1 is narrower than a fourth width w4' of the fourth grid portion 250_P4 between the normal filter regions 260*n*. As another example, unlike this, the fourth width w4' may be wider than each of the first to third widths. That is, grid portions disposed adjacent to the auto focus filter regions 260*af* may be adjusted to have a greater width as they move away from the central region of the chip structure 13, and the widths of the grid portions may be adjusted independently of those of the grid portions between the normal filter regions 260*n*.

Figure 6:
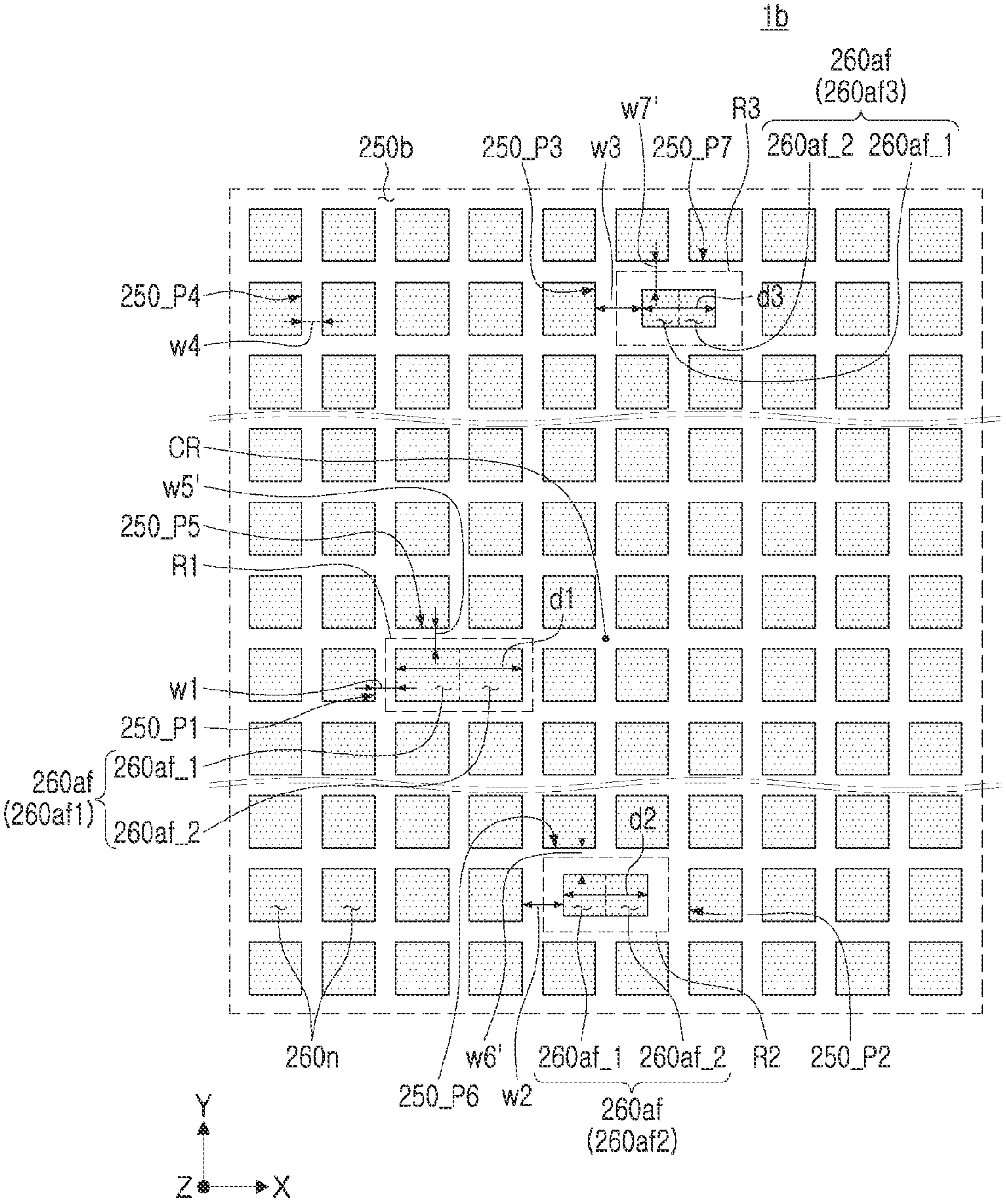
FIG. 6 is a top plan view illustrating an image sensor according to example embodiments.

Referring to FIG. 6, in an image sensor 1*b*, a grid structure 250*b* have fifth to seventh grid portions 250_P5, 250_P6 and 250_P7 having different widths. In an embodiment, a fifth width w5' of the fifth grid portion 250_P5 is narrower or smaller than a sixth width w6' of the sixth grid portion 250_P6, and the sixth width w6' is narrower or smaller than a seventh width w7' of the seventh grid portion 250_P7.

Figure 7:
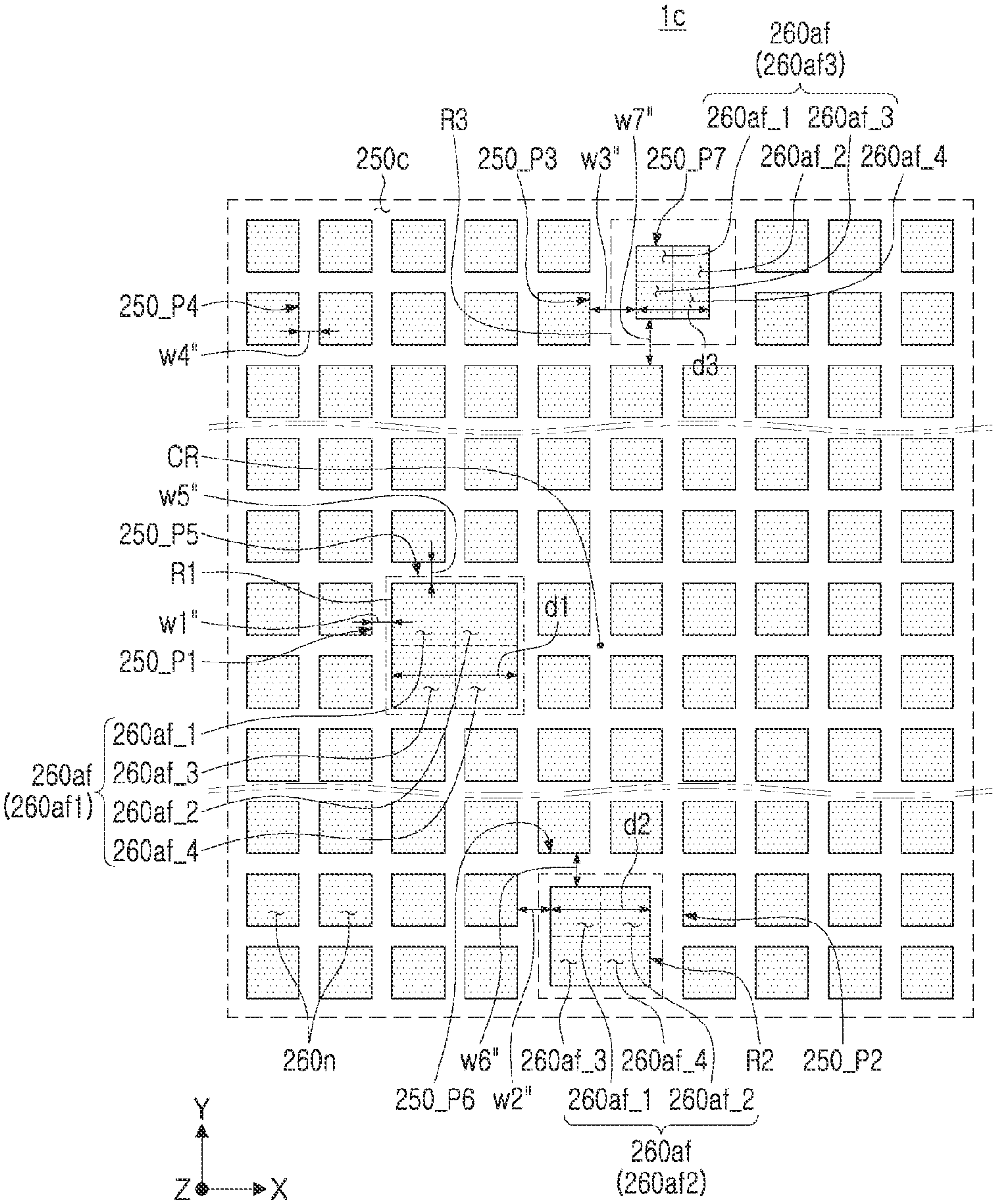
FIG. 7 is a top plan view illustrating an image sensor according to example embodiments.

Referring to FIG. 7, in an image sensor 1*c*, each of the auto focus filter regions 260*af* include first to fourth portions 260*af*_1, 260*af*_2, 260*af*_3 and 260*af*_4 disposed adjacent to each other. The first to fourth portions 260*af*_1, 260*af*_2, 260*af*_3 and 260*af*_4 may be integrally connected to each other, and the grid structure 250 may surround external peripheries of the first to fourth portions 260*af*_1, 260*af*_2, 260*af*_3 and 260*af*_4. This may be because the auto focus group, which is a unit for performing one auto focus function, is made up of four phase difference detection regions. For example, the first to fourth portions 260*af*_1, 260*af*_2, 260*af*_3 and 260*af*_4 may be arranged into a square shape.

In a grid structure 250*c*, a first width w1" of the first grid portion 250_P1 defining a side surface of the first auto focus filter region 260*af*1 in the X-direction may be identical to or substantially identical to a fifth width w5" of the fifth grid portion 250_P5 defining a side surface of the first auto focus filter region 260*af*1 in the Y-direction.

In the grid structure 250*c*, the first width w1" of the first grid portion 250_P1 defining the side surface of the first auto focus filter region 260*af*1 in the X-direction may be narrower or smaller than a second width w2" of the second grid portion 250_P2 defining a side surface of the second auto focus filter region 260*af*2 in the X-direction. The second width w2" may be narrower or smaller than a third width w3" of the third grid portion 250_P3 defining a side surface of the third auto focus filter region 260*af*3 in the X-direction.

Figure 8:
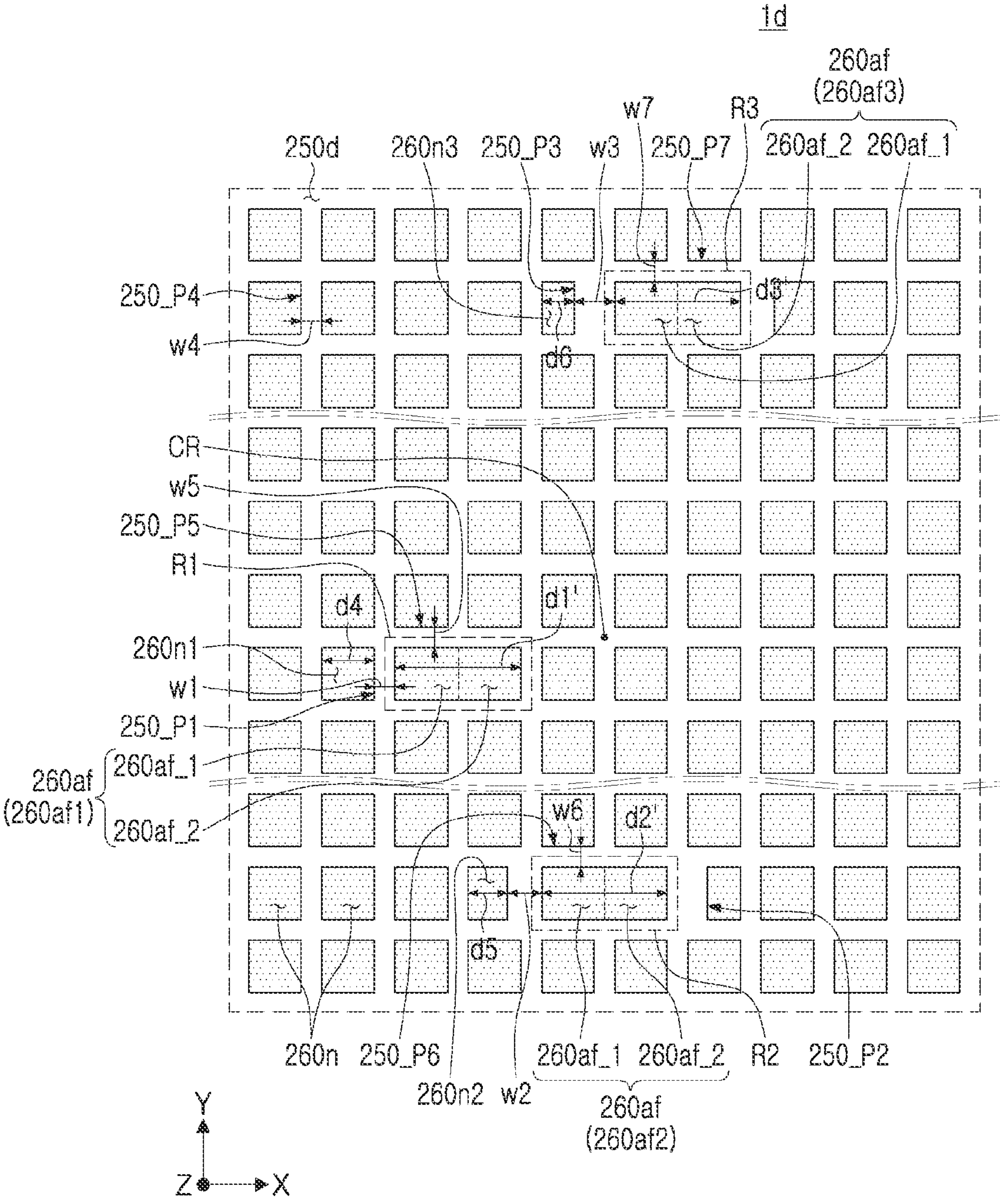
FIG. 8 is a top plan view illustrating an image sensor according to an example embodiment.

Referring to FIG. 8, in an image sensor 1*d*, each of first to third lengths d1', d2' and d3' of the first to third auto focus filter regions 260*af*1, 260*af*2 and 260*af*3 in the X-direction may be identical to or substantially identical to each other. Further, a grid structure 250*d* is present. However, in an embodiment, a first normal filter region 260*n*1 disposed adjacent to the first auto focus filter regions 260*af*1 in the X-direction, a second normal filter region 260*n*2 disposed adjacent to the second auto focus filter regions 260*af*2 in the X-direction, and a third normal filter region 260*n*3 disposed adjacent to the third auto focus filter regions 260*af*3 in the X direction may have different sizes. For example, a fourth length d4 of the first normal filter region 260*n*1 in the X-direction may be greater than a fifth length d5 of the second normal filter region 260*n*2 in the X-direction, and the fifth length d5 may be greater than a sixth length d6 of the third normal filter region 260*n*3. This may be because the first to third grid portions 250_P1, 250_P2 and 250_P3 are formed to adjust the size of the adjacent normal filter regions 250*n* while uniformly maintaining the size of the auto focus filter regions 260*af* for each region, unlike FIG. 3.

Figure 9:
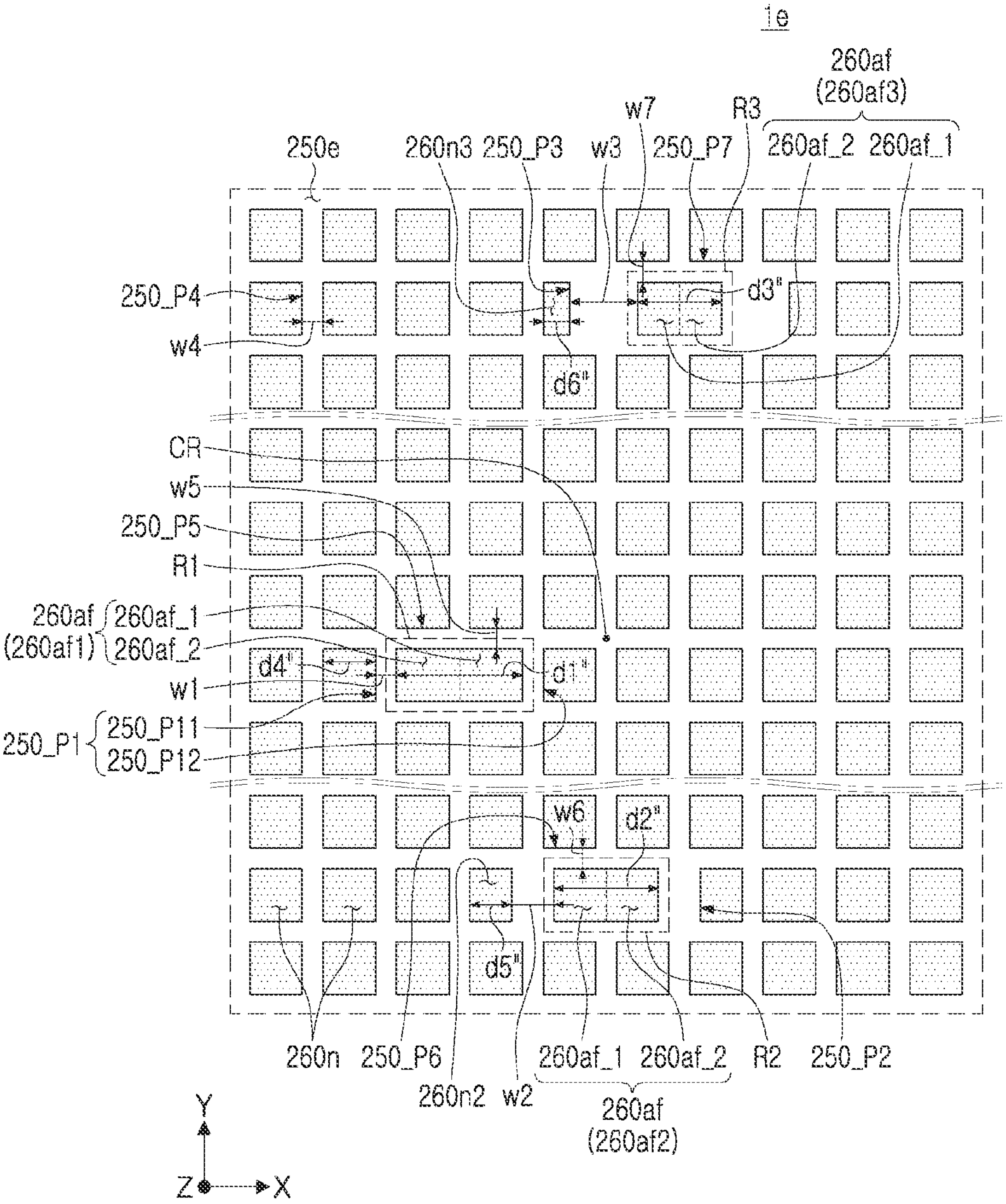
FIG. 9 is a top plan view illustrating an image sensor according to an example embodiment.

Referring to FIG. 9, in an image sensor 1*e*, first to third lengths d1", d2" and d3" of the first to third auto focus filter regions 260*af*1, 260*af*2 and 260*af*3 are different from each other in the X-direction. Further, a grid structure 250*e* is present. In an embodiment, the first length d1" is greater than the second length d2" and the second length d2" is greater than the third length d3". Furthermore, fourth to sixth lengths d4", d5" and d6" of the first to third normal filter regions 260*n*1, 260*n*2 and 260*n*3 are different from each other in the X-direction. In an embodiment, the fourth length d4" is greater than the fifth length d5", and the fifth length d5" is greater than the sixth length d6".

Figure 10:
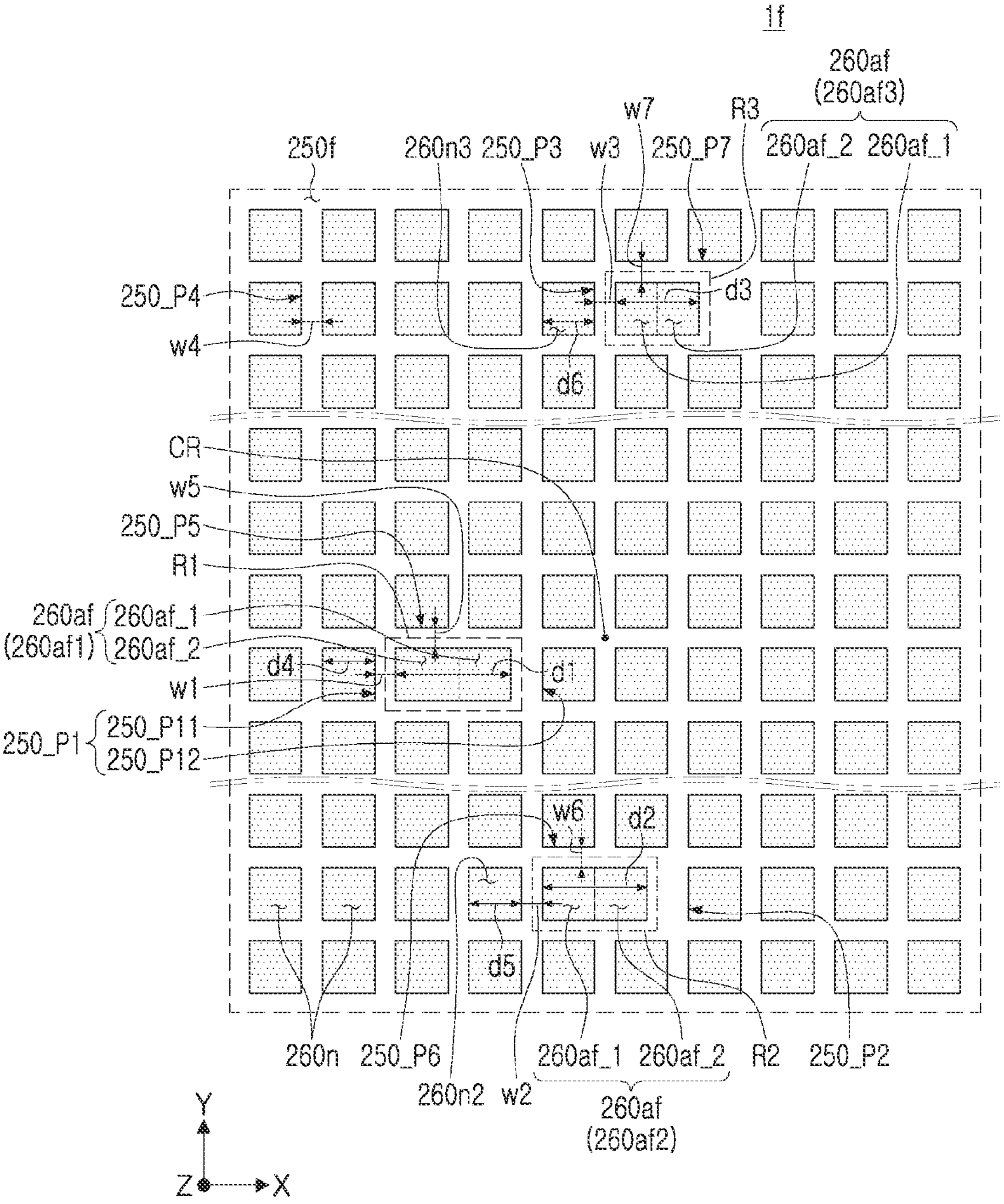
FIG. 10 is a top plan view illustrating an image sensor according to an example embodiment.

Referring to FIG. 10, in an image sensor 1*f*, the first grid portion 250_P1 of a grid structure 250*f* may include a first sub-grid portion 250_P11 defining a first side surface s1 of the first auto focus filter region 260*af*1 in the X-direction and a second sub-grid portion 250_P12 defining a second side s2 facing the first side s1. In an embodiment, a width of the first sub-grid portion 250_P11 is different from a width of the second sub-grid portion 250_P12. This may be similarly described for the second and third grid portions 250_P2 and 250_P3. In an embodiment, an average width of the first grid portion 250_P1 is narrower or smaller than an average width of the second grid portion 250_P2, and the average width of the second grid portion 250_P2 is narrower or smaller than an average width of the third grid portion 250_P3.

Figure 11:
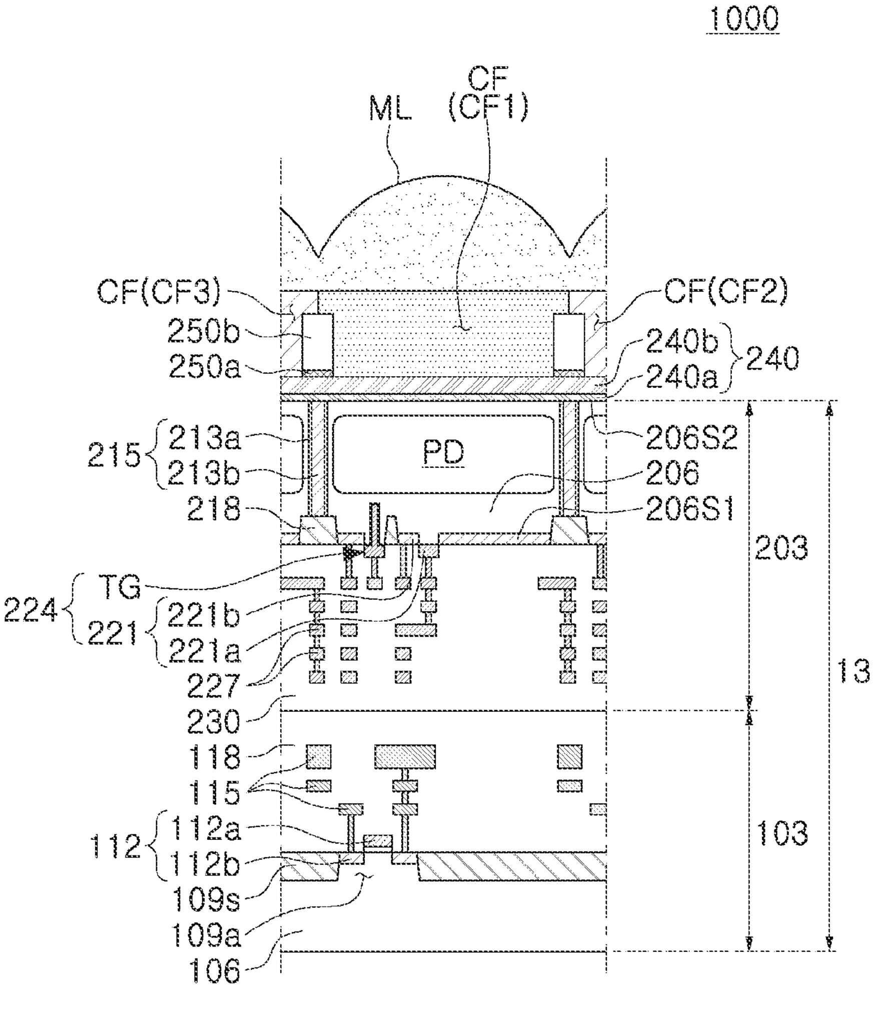
FIG. 11 is a cross-sectional view illustrating an image sensor according to an example embodiment.

FIG. 11 is a cross-sectional view illustrating an image sensor according to an example embodiment. FIG. 11 illustrates a region in which normal pixel regions PDn are disposed, in a region disposed adjacent to the central region CR of the pixel array region of the chip structure 13. FIG. 11 is a diagram exemplarily illustrating an example of a configuration of the chip structure 13 among constituents of an image sensor according to an example embodiment, and descriptions overlapping those described in FIGS. 3 and 4 will be omitted.

Referring to FIG. 11, an image sensor 1000 may have a stacked chip structure to which at least two chips are applied. The chip structure 13 of the image sensor 1000 may include a first chip structure 103 and a second chip structure 203 disposed on the first chip structure 103. The first chip structure 103 may be a logic chip, and the second chip structure 203 may be an image sensor chip. For example, the logic chip may perform logic operations and the image sensor chip may perform image sensing operations for a pixel. According to example embodiments, the first chip structure 103 may be a stacked chip structure including a logic chip and a memory chip.

The first chip structure 103 may include a first substrate 106, an element separation film 109*s* defining an active region 109*a* on the first substrate 106, a first circuit element 112 and a first wiring structure 115 disposed over the first substrate 106, and a first insulating structure 118 covering the first circuit element 112 and the first wiring structure 115 over the first substrate 106.

The first substrate 106 may be a semiconductor substrate. The first substrate 106 may be a substrate formed of a semiconductor material, for example, a single crystalline silicon substrate. The first circuit element 112 may include an element such as a transistor including a gate 112*a* and a source/drain 112*b*.

The second chip structure 203 may include a second substrate 206, an element separation film 218 disposed in the second substrate 206 and limiting an active region, a second circuit element 224 and a second wiring structure 227 disposed between the second substrate 206 and the first chip structure 103, and a second insulating structure 230 covering the second circuit element 224 and the second wiring structure 227 between the second substrate 206 and the first chip structure 103. The second chip structure 203 may further include normal pixel regions PDn and a separation structure 215 in the second substrate 206. In a region not illustrated, the second chip structure 203 may include auto focus pixel regions PDaf (see FIGS. 3 and 4) disposed parallel to the normal pixel regions PDn.

The second substrate 206 may have a first surface 206S1 and a second surface 206S2 facing the first surface 206S1. The first surface 206S1 of the second substrate 206 may face the first chip structure 103. The second substrate 206 may be a semiconductor substrate. The second substrate 206 may be a substrate formed of a semiconductor material, for example, a single crystalline silicon substrate.

The element separation film 218 may be disposed on the first surface 206S1 of the second substrate 206 and may limit the active region. The element separation film 218 may be formed of an insulating material such as silicon oxide.

The second circuit element 224 and the second wiring structure 227 may be disposed between the first surface 206S1 of the second substrate 206 and the first chip structure 103.

The second circuit element 224 may include a transfer gate TG and active elements 221. The active elements 221 may be transistors including a gate 221*a* and a source/drain 221*b*. The transfer gate TG may transfer electric charges from an adjacent normal pixel region PDn to an adjacent floating diffusion region. The active elements 221 may be various transistors of the pixel circuit described in FIGS. 2A and 2B, for example, a driving transistor, a reset transistor, and a select transistor.

The transfer gate TG may be a vertical transfer gate including a portion extending from the first surface 206S1 of the second substrate 206 to an interior of the second substrate 206.

The second wiring structure 227 may include multi-layered wirings disposed at different height levels and vias configured to electrically connect the multi-layered wirings and electrically connect the multi-layered wirings to the second circuit element 224.

The second insulating structure 230 may cover the second circuit element 224 and the second wiring structure 227 between the first surface 206S1 of the second substrate 206 and the first chip structure 103.

The second insulating structure 230 may be in contact with and bonded to the first insulating structure 118. Each of the first and second insulating structures 118 and 230 may be formed of multiple layers including different types of insulating layers. For example, the second insulating structure 230 may be formed of multiple layers including at least two or more of a silicon oxide layer, a low dielectric layer, and a silicon nitride layer.

The normal pixel regions PDn may generate and accumulate electric charges corresponding to incident light. The normal pixel regions PDn may include, for example, a photo diode, a photo transistor, a photo gate, a pinned photo diode (PPD), and combinations thereof. The normal pixel regions PDn may include first to third normal pixel regions on which light of different colors is incident, and an arrangement relationship thereof may be variously changed according to example embodiments.

The separation structure 215 may be disposed to surround each of the normal pixel regions PDn. The separation structure 215 may vertically penetrate through at least a portion of the second substrate 206. For example, the separation structure 215 may vertically penetrate through the second substrate 206. The separation structure 215 may be connected to the element separation film 218. The separation structure 215 may include a separation pattern 213*b* and a separation insulating layer 213*a* covering a side surface of the separation pattern 213*b*. For example, the separation insulating layer 213*a* may surround or enclose the separation pattern 213*b*. For example, the separation insulating layer 215*a* may include silicon oxide, and the separation pattern 213*b* may include polysilicon. However, according to an example embodiment, the number of layers of the separation structure 215 may be variously changed.

The image sensor 1000 may include an insulating structure 240 disposed on the second chip structure 203. The insulating structure 240 may include a plurality of layers sequentially stacked. For example, the insulating structure 240 may include a lower layer 240*a* and an upper layer 240*b* disposed on the lower layer 240*a*. In an embodiment, the lower layer 240*a* has permeability at a visible wavelength and may include a material that has a negative charge to prevent a charge by means of a dangling bond of the second surface 206S2 of the second substrate 206. In an embodiment, the upper layer 240*b* includes a first upper material layer configured to have the permeability at the visible wavelength and adjust a peak of the permeability by adjusting a thickness thereof, and a second upper material layer configured to have the permeability at the visible wavelength and perform passivation. The lower layer 240*a* may include a high-k dielectric, for example, aluminum oxide, and the upper layer 240*b* may include at least one high-k dielectric layer and at least one silicon oxide layer.

The image sensor 1000 may include a grid structure 250 disposed on the insulating structure 240. The grid structure 250 may include a plurality of layers sequentially stacked, for example, a first layer 250*a* and a second layer 250*b* disposed on the first layer 250*a*. In an embodiment, a thickness of the second layer 250*b* is greater than that of the first layer 250*a*. In an embodiment, a first material of the first layer 250*a* is different from a second material of the second layer 250*b*. As an example, the first material of the first layer 250*a* may include or be a conductive material. For example, the first layer 250*a* may be formed of the conductive material including at least one of a metal or a metal nitride. For example, the first layer 250*a* may include at least one of Ti, Ta, TiN, TaN, or W. As an example, the second material of the second layer 250*b* may include an insulating material. The second material of the second layer 250*b* may be a low refractive index (LRI) material. For example, the second layer 250*b* may have a refractive index ranging from about 1.1 to about 1.8. The second layer 250*b* may include an oxide or a nitride including Si, Al, or combinations thereof. For example, the second layer 250*b* may include silicon oxide having a porous structure or silica nanoparticles having a network structure. The first layer 250*a* formed of a conductive material may serve as a charge path for removing a charge, and the second layer 250*b* may be formed of a low refractive index (LRI) material without including a conductive material that may reduce sensitivity in the pixel regions, thereby reducing an optical cross-talk phenomenon of the image sensor 1000. As described with reference to FIGS. 3 to 10, the grid structure 250 may include grid portions having different widths for each region.

The image sensor 1000 may include color filters CF covering the grid structure 250 on the insulating structure 240. The color filters CF may include first to third color filters CF1, CF2 and CF3 of different colors. For example, the first color filter CF1 may be a green color filter, the second color filter CF2 may be a blue color filter, and the third color filter CF3 may be a red color filter. The color filters CF may include color filter regions 260*n* and 260*af* defined by the grid structure 250 as described in FIGS. 3 to 10.

The image sensor 1000 may further include micro lenses MF disposed on the color filters CF. The micro lenses MF may include lens regions 270*n* and 270*af* as described with reference to FIGS. 3 to 10.

Figure 12:
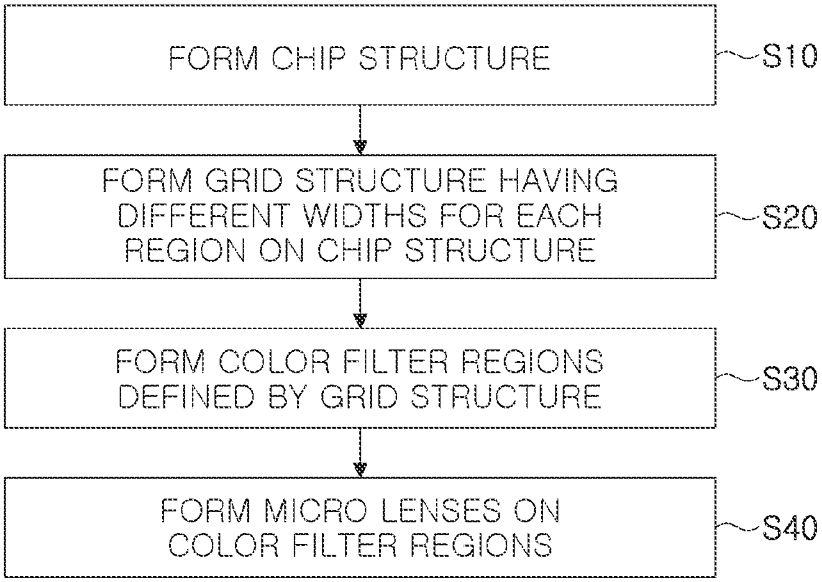
FIG. 12 is a flowchart illustrating a method of manufacturing an image sensor according to an example embodiment.

FIG. 12 is a flowchart illustrating a method of manufacturing an image sensor according to an example embodiment. With reference to FIG. 12 with FIGS. 3, 4 and 11, an exemplary example of the method for manufacturing an image sensor according to an example embodiment of the present disclosure will be described.

The method of FIG. 12 includes forming a chip structure 13 (S10).

The first chip structure 103 including the first circuit element 112 may be formed. An element separation film 109*s* limiting an active region 109*a* may be formed on the first substrate 106, and the first circuit element 112 may be formed over the first substrate 106. Next, a first wiring structure 115 electrically connected to the first circuit element 112 and a first insulating structure 118 covering the first circuit element 112 and the first wiring structure 115 may be formed over the first substrate 106. In an exemplary embodiment, the first wiring structure 115 and the first insulating structure 118 may be formed to be divided several times so that the first wiring structure 115 may include wiring lines disposed at a plurality of levels. The first circuit element 112 and the first wiring structure 115 may be referred to as a circuit wiring structure.

The second chip structure 203 including pixel regions PDn and PDaf may be formed. For example, the second chip structure 203 may be formed on the first chip structure 103. Forming the second chip structure 203 may include forming the separation structure 215 and the pixel regions PDn and PDaf in the second substrate 206, forming the element separation film 218 limiting the active region on the first surface 206S1 of the second substrate 206, forming the second circuit element 224 on the first surface 206S1 of the second substrate 206, and forming the second wiring structure 227 and the second insulating structure 230 covering the second circuit element 224 and the second wiring structure 227 on the first surface 206S1 of the second substrate 206. The order of forming the separation structure 215, the pixel regions PDn and PDaf, and the element separation film 218 may be variously modified. In one example, two auto focus pixel regions PDaf are disposed adjacent to each other in the X-direction, and normal pixel regions PDn are disposed to surround the two auto focus pixel regions PDaf, but an arrangement relationship of the pixel regions PDn and PDaf may be variously changed.

The chip structure 13 may be formed by bonding the first chip structure 103 and the second chip structure 203. For example, the first chip structure 103 may be bonded to the second chip structure 203. In an example embodiment, the chip structure 13 may be formed by performing a wafer bonding process of bonding two wafers. Accordingly, the first insulating structure 118 of the first chip structure 103 and the second insulating structure 230 of the second chip structure 203 may be bonded to each other. For example, the separation structure 215 may be exposed by performing a grinding process of reducing a thickness of the second substrate 206.

Next, an insulating structure 240 may be formed on the chip structure 13, and a grid structure 250 having different widths for each region may be formed on the insulating structure 240 (S20). For example, the grid structure 250 having different widths may be formed on the chip structure 13.

The insulating structure 240 may be formed on the second surface 206*s*2 of the second substrate 206, conductive materials and insulating materials may be sequentially deposited, and then the grid structure 250 may be formed to have a mesh shape on the insulating structure 240 through a patterning process. The grid structure 250 may be formed to have different widths for each region through the patterning process.

In an example embodiment, the chip structure 13 includes a first region R1 spaced from the central region CR of the pixel array region of the chip structure 13 by a first distance, a second region R2 spaced from the central region CR of the pixel array region of the chip structure 13 by a second distance greater than the first distance, and a third region R3 spaced from the central region CR of the pixel array region of the chip structure 13 by a third distance greater than the second distance. In an embodiment, the auto focus pixel regions PDaf includes a first auto focus group including first auto focus pixel regions PDaf1 disposed in the first region R1, a second auto focus group including second auto focus pixel regions PDaf2 disposed in the second region R2, and a third auto focus group including third auto focus pixel regions PDaf3 disposed in the third region R3. The grid structure 250 may have a first grid portion 250_P1 having a first width w1 on a region adjacent to the first region R1, a second grid portion 250_P2 having a second width w2 on a region adjacent to the second region R2, and a third width 250_P on a region adjacent to the third region R3. In an embodiment, the first width w1 is narrower or smaller than the second width w2, and the second width w2 is narrower or smaller than the third width w3. With an increase in a distance from the central region CR of the pixel array region of the chip structure 13, a grid portion having a greater width may be disposed to provide an image sensor that reduces a cross-talk phenomenon of the auto-focus groups and having increased uniformity of auto-focus capabilities.

Next, color filter regions 260 defined by the grid structure 250 are formed (S30).

Color filters CF may be formed by depositing a color filter material on the insulating structure 240. The color filters CF may be formed to cover the grid structure 250, and the color filters CF may include color filter regions 260 defined by the grid structure 250. The color filter regions 260 may be formed to correspond to the normal pixel regions PDn and the auto focus pixel regions PDaf.

Next, micro lenses MF are formed on the color filters CF (S40).

On the color filters CF, a TMR-based resin (produced by Tokyo Ohka Kogo, Co.) or an MFR-based resin (produced by Japan Synthetic Rubber Corporation) that conformally covers the color filters CF may be formed to form a lens material layer. However, the material of the lens material layer is not limited thereto. Next, after removing the lens material layer by a predetermined depth through exposure and etching processes, a reflow process and an etch-back process may be performed to form the micro lenses MF.

The present disclosure is not limited to the above-described embodiments and the accompanying drawings. It will be understood by those skilled in the art that various substitutions, modification and changes in form and details may be made therein without departing from the spirit and scope of the present disclosure as defined by the appended claims, which also belongs to the present disclosure.

What is claimed is:

1. An image sensor comprising:

a chip structure including normal pixel regions and auto focus pixel regions;

a grid disposed on the chip structure; and color filter regions defined by the grid over the chip structure, the color filter regions including normal filter regions and auto focus filter regions, wherein the normal filter regions correspond to the normal pixel regions, one auto focus filter region among the auto focus filter regions corresponds to at least two auto focus pixel regions disposed adjacent to each other among the auto focus pixel regions, the chip structure includes a first region spaced from a central region of a pixel array region of the chip structure by a first distance, and a second region spaced from the central region of the pixel array region of the chip structure by a second distance greater than the first distance, the auto focus filter regions include a first auto focus filter region disposed on the first region and a second auto focus filter region disposed on the second region, each of the first auto focus filter region and the second auto focus filter region extends continuously to cover portions of at least two auto focus pixel regions disposed adjacent to each other among the auto focus pixel regions, a first width of a first grid portion disposed adjacent to the first auto focus filter region among the grid is narrower than a second width of a second grid portion disposed adjacent to the second auto focus filter region among the grid, one or more of the normal filter regions are disposed between the first auto focus filter region and the second auto focus filter region to separate the first auto focus filter region and the second auto focus filter region from each other, a fourth grid portion between the normal filter regions disposed adjacent to each other in the second region among the grid has a fourth width, the fourth width is narrower than the second width, on a level of the grid, normal filter regions among the normal filter regions immediately surrounding a respectively one of the first and second auto focus filter regions have the same size, the chip structure further includes a third region spaced from the central region of the pixel array region of the chip structure by a third distance greater than the second distance, the auto focus filter regions further include a third auto focus filter region disposed on the third region, and a third width of a third grid portion disposed adjacent to the third auto focus filter region among the grid is wider than the second width.

2. The image sensor of claim 1, wherein the first grid portion is disposed between the first auto focus filter region among the grid and a first normal filter region disposed adjacent to the first auto focus filter region in a first horizontal direction among the normal filter regions, and the second grid portion is disposed between the second auto focus filter region among the grid and a second normal filter region disposed adjacent to the second auto focus filter region in the first horizontal direction among the normal filter regions.

3. The image sensor of claim 2, wherein among the auto focus pixel regions, at least two auto focus pixel regions disposed adjacent to each other include a first phase difference detection region and a second phase difference detection region disposed adjacent to each other in the first horizontal direction, and wherein each of the auto focus filter regions includes a first portion corresponding to the first phase difference detection region and a second portion corresponding to the second phase difference detection region.

4. The image sensor of claim 3, wherein the first width is a distance between the first portion of the first auto focus filter region and a normal filter region arranged side by side in the first horizontal direction or a distance between the second portion of the first auto focus filter region and the normal filter region arranged side by side in the first horizontal direction.

5. The image sensor of claim 3, wherein the first portion and the second portion include a same color filter.

6. The image sensor of claim 3, wherein the grid surrounds external sides of the first portion and the second portion without being disposed between the first portion and the second portion.

7. The image sensor of claim 2, wherein a fifth grid portion between the first auto focus filter region among the grid and a third normal filter region disposed adjacent to the first auto focus filter region in a second horizontal direction among the normal filter region has a fifth width, a sixth grid portion between the second auto focus filter region among the grid and a fourth normal filter region disposed adjacent to the second auto focus filter region in the second horizontal direction among the normal filter region has a sixth width, the fifth width is substantially identical to the sixth width, and the second horizontal direction is perpendicular to the first horizontal direction.

8. The image sensor of claim 1, further comprising:

micro lens regions disposed on the color filter regions and corresponding to each of the color filter regions, wherein the micro lens regions include normal lens regions corresponding to the normal filter regions and auto focus lens regions corresponding to the auto focus filter regions, and a size of each of the normal lens regions is smaller than a size of each of the auto focus lens regions.

9. The image sensor of claim 8, wherein the auto focus lens regions include a first auto focus lens region corresponding to the first auto focus filter region and a second auto focus lens region corresponding to the second auto focus filter region, and on a plane, a first distance misaligned between a central region of the first auto focus filter region and a central region of the first auto focus lens region is shorter than a second distance misaligned between a central region of the second auto focus filter region and a central region of the second auto focus lens region.

10. The image sensor of claim 1, wherein each of the color filter regions extends onto an upper surface of the grid.

11. An image sensor comprising:

a chip structure including normal pixel regions and auto focus pixel regions;

a grid disposed on the chip structure; and color filter regions defined by the grid over the chip structure, the color filter regions including normal filter regions and auto focus filter regions, wherein the normal filter regions correspond to the normal pixel regions, one auto focus filter region among the auto focus filter regions corresponds to at least two auto focus pixel regions disposed adjacent to each other among the auto focus pixel regions, the chip structure includes a first region spaced from a central region of a pixel array region of the chip structure by a first distance, and a second region spaced from the central region of the pixel array region of the chip structure by a second distance greater than the first distance, the auto focus filter regions include a first auto focus filter region disposed on the first region and a second auto focus filter region disposed on the second region, and a first length of the first auto focus filter region in a first horizontal direction is longer than a second length of the second auto focus filter region in the first horizontal direction, a fourth grid portion between the normal filter regions disposed adjacent to each other in the second region among the grid has a fourth width, the fourth width is narrower than a second width of a second grid portion disposed adjacent to the second auto focus filter region among the grid, on a level of the grid, normal filter regions among the normal filter regions immediately surrounding a respectively one of the first and second auto focus filter regions have the same size, the chip structure further includes a third region spaced from the central region of the pixel array region of the chip structure by a third distance greater than the second distance, the auto focus filter regions further include a third auto focus filter region disposed on the third region, and a third width of a third grid portion disposed adjacent to the third auto focus filter region among the grid is wider than the second width.

12. The image sensor of claim 11, wherein among the auto focus pixel regions, at least two auto focus pixel regions disposed adjacent to each other include a first phase difference detection region and a second phase difference detection region disposed adjacent to each other in the first horizontal direction, and each of the auto focus filter regions includes a first portion corresponding to the first phase difference detection region and a second portion corresponding to the second phase difference detection region.

13. The image sensor of claim 12, further comprising:

micro lens regions disposed on the color filter regions, wherein the micro lens regions include a normal lens region corresponding to each of the normal filter regions and an auto focus lens region corresponding to the first and second phase difference detection regions, and a width of the auto focus lens region in the first horizontal direction is wider than a width of the normal lens region in the first horizontal direction.

14. The image sensor of claim 11, wherein a length of the first auto focus filter region in a second horizontal direction is substantially identical to a length of the second auto focus filter region in the second horizontal direction, and the second horizontal direction is perpendicular to the first horizontal direction.

15. The image sensor of claim 11, wherein a first width of a first grid portion defining a side surface of the first auto focus filter region in the first horizontal direction among the grid is narrower than a second width of a second grid portion defining a side surface of the second auto focus filter region in the first horizontal direction among the grid.

16. An image sensor comprising:

a first chip structure including a first substrate and a first circuit element on the first substrate;

a second chip structure disposed on the first chip structure, and including a second substrate including normal pixel regions and auto focus pixel regions and a second circuit device between the second substrate and the first chip structure;

a grid disposed on the second chip structure;

color filter regions defined by the grid over the second chip structure; and micro lens regions disposed on the color filter regions, wherein the color filter regions include normal filter regions and auto focus filter regions, the normal filter regions correspond to the normal pixel regions, one auto focus filter region among the auto focus filter regions corresponds to at least two auto focus pixel regions disposed adjacent to each other among the auto focus pixel regions, the second chip structure includes a first region spaced from a central region of a pixel array region of the second chip structure by a first distance, and a second region spaced from the central region of the pixel array region of the second chip structure by a second distance greater than the first distance, the auto focus filter regions include a first auto focus filter region on the first region and a second auto focus filter region on the second region, a first width of a first grid portion defining a side surface of the first auto focus filter region in a first horizontal direction among the grid is narrower than a second width of a second grid portion defining a side surface of the second auto focus filter region in the first horizontal direction among the grid, a fourth grid portion between the normal filter regions disposed adjacent to each other in the second region among the grid has a fourth width, the fourth width is narrower than the second width, on a level of the grid, normal filter regions among the normal filter regions immediately surrounding a respectively one of the first and second auto focus filter regions have the same size, the second chip structure further includes a third region spaced from the central region of the pixel array region of the second chip structure by a third distance greater than the second distance, the auto focus filter regions further include a third auto focus filter region disposed on the third region, and a third width of a third grid portion disposed adjacent to the third auto focus filter region among the grid is wider than the second width.

17. The image sensor of claim 16, wherein a fifth width of a fifth grid portion defining a side surface of the first auto focus filter region in a second horizontal direction among the grid is substantially identical to a sixth width of a sixth grid portion in contact with a side surface of the second auto focus filter region in the second horizontal direction among the grid, and the second horizontal direction is perpendicular to the first horizontal direction.

* * * * *